Figure 1:
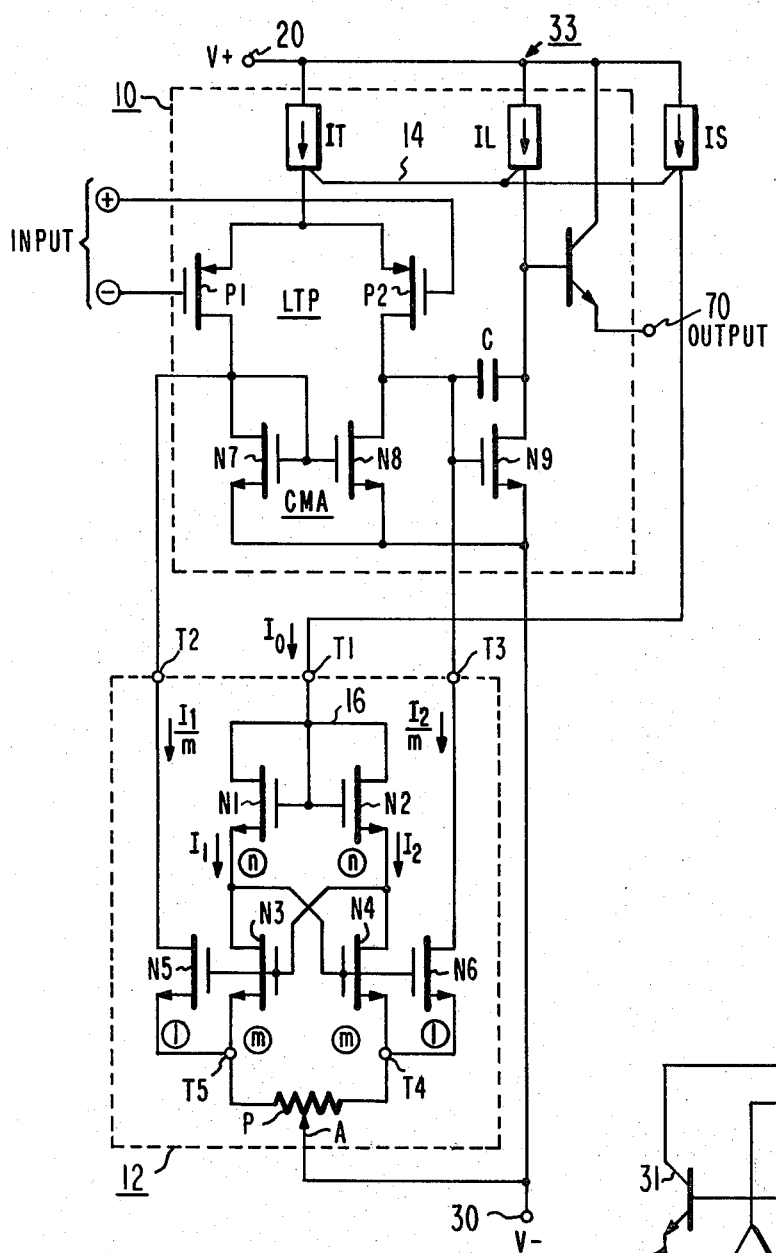

United States Patent [19]

Schade, Jr.

[11] 4,366,444
[45] Dec. 28, 1982

[54] TEMPERATURE-INDEPENDENT CURRENT TRIMMING ARRANGEMENT

[75] Inventor: Otto H. Schade, Jr., North Caldwell, N.J.

[73] Assignee: RCA Corporation, New York, N.Y.

[21] Appl. No.: 230,382

[22] Filed: Feb. 2, 1981

[51] Int. Cl.³ .......................... H03F 1/30; H03F 3/45; H03F 3/16
[52] U.S. Cl. .................................... 330/256; 330/253; 330/257; 330/261
[58] Field of Search .............. 330/253, 256, 257, 261, 330/288, 289, 307; 307/297; 323/315, 316

[56] References Cited

U.S. PATENT DOCUMENTS

| | | | |
|---|---|---|---|
| 3,835,410 | 9/1974 | Wittlinger | 330/288 |
| 3,873,933 | 3/1975 | Wheatley, Jr. | 330/257 |
| 3,930,172 | 12/1975 | Dobkin | 307/297 |
| 4,137,506 | 1/1979 | Iwamatsu et al. | 330/288 |
| 4,243,948 | 1/1981 | Schade, Jr. | 330/289 |
| 4,268,759 | 5/1981 | Gilbert | 307/490 |

OTHER PUBLICATIONS

S. Pookaiyaudom et al., "Precise Wide-Dynamic Range Constant Current Ratio Circuits", *Proceedings of the IEEE*, vol. 65, No. 10, Oct. 1977, pp. 1514–1515.
B. Gilbert et al., "A Wideband Two-Quadrant Analog Multiplier", *Digest of Technical Papers, 1980 IEEE International Solid-State Circuits Conference*, Feb. 1980, FAM 15.3, pp. 200–201.

*Primary Examiner*—James B. Mullins
*Attorney, Agent, or Firm*—E. M. Whitacre; P. J. Rasmussen; Clement A. Berard, Jr.

[57] ABSTRACT

A current amplifier includes six transistors of like conductivity on a substrate, the first and second transistors being diode-connected to receive input current, and the third and fourth having their main conduction paths serially connected with those of the first and second transistors, respectively. The gates of the third and fourth transistors are cross coupled with their drains. The gate-source connections of the fifth and sixth transistors are respectively connected in parallel with the gate-source connections of the third and fourth transistors. A potentiometer connects the respective sources of the third and fourth transistors to a common terminal for adjusting the relative portion of the input current in the aforementioned main conduction paths, thereby to proportionally adjust the drain currents of the fifth and sixth transistors.

12 Claims, 2 Drawing Figures

TEMPERATURE-INDEPENDENT CURRENT TRIMMING ARRANGEMENT

This invention relates to temperature-independent current trimming arrangements and, in particular, to such arrangements suitably employed with operational amplifiers and extrapolated band-gap voltage reference generating circuits.

U.S. patent application Ser. No. 230,383 (RCA 75,414) entitled TEMPERATURE-INDEPENDENT TRIMMING OF EXTRAPOLATED BAND-GAP REFERENCE VOLTAGE CIRCUITS filed by A. L. Limberg on even date herewith, which invention is assigned to the same assignee as is the present invention, and is incorporated herein by reference describes temperature-independent current trimming arrangements. Those arrangements supply a single output current. Further, Limberg's output current flows from a serially connected pair of transistors across which a substantial potential must be maintained, which requirement undesirably restricts application to situations where such potentials are tolerable. That restriction could preclude utilization in certain operational amplifiers and extrapolated bandgap voltage regulators where operation close to supply potential is necessary.

The present invention, on the other hand, provides a plurality of temperature-independent output currents each of which is obtained from an output circuit employing a single transistor across which a substantially smaller potential than that of Limber's arrangement can be maintained. A current amplifier of the present invention comprises input, first and second output, and third and fourth terminals on a substrate, and first, second, third fourth, fifth and sixth transistors on the substrate. The respective input and output electrodes of the first and second transistors connect to the input terminal and the common electrode of the first transistor connects to the output electrode of the third transistor and to the respective input electrodes of the fourth and sixth transistors. The common electrode of the second transistor connects to the output electrode of the fourth transistor and to the respective input electrodes of the third and fifth transistors. The respective output electrodes of the fifth and sixth transistors connect to the first and second output terminals respectively. The common electrodes of the third and fifth transistors connect to the third terminal and thence to a common terminal through a first resistance path, and the common electrodes of the fourth and sixth transistors connect to the fourth terminal and thence to the common terminal through a second resistance path; the first and second resistance paths exhibiting respective resistances in a proportion substantially unaffected by temperature.

Figure 2:
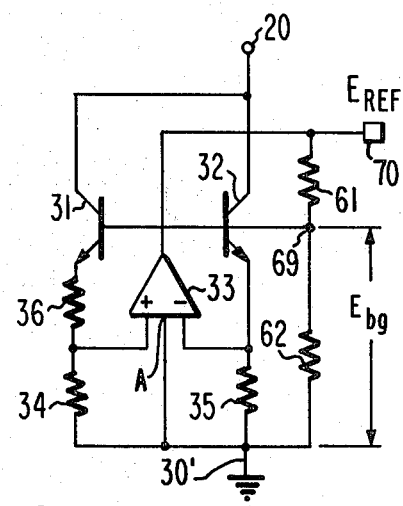

In The Drawings:

FIG. 1 is a schematic diagram of an embodiment of the present invention within an amplifier circuit; and FIG. 2 is a schematic diagram of the embodiment of FIG. 1 employed in an extrapolated band-gap voltage reference circuit.

In FIG. 1, exemplary amplifier circuit 33 includes differential-input amplifier 10 and temperature independent current amplifier 12 useful for trimming amplifier 10 as explained below. Amplifier 10 includes a differential amplifier circuit including long-tailed pair LTP formed by P-channel field-effect transistors (FETs) P1 and P2 receiving tail current from relatively positive potential V+ at supply terminal 20 via current source IT, receiving input signals from IN terminals "+" and "−", and providing output signals responsive to the input signals at the respective drains of P1 and P2. A load circuit for LTP includes N-channel FETs N7 and N8 connected as a current mirror amplifier (CMA) having an input terminal at the interconnection of the drain of N7 and the gates of N7 and N8, an output connection at the drain of N8 and a common connection to relatively negative operating potential V− at terminal 30. Differential output signals from LTP are converted to a single-ended signal at the drain of N8 by CMA and are then amplified by common-source N-channel FET N9 which receives load current from current source IL. Signal from the drain of N9 is supplied to output terminal 70 of amplifier 33 by emitter-follower NPN transistor Q1.

Amplifier 10 would ordinarily be designed to provide an output potential at terminal 70 that is the average of supply potentials V+ and V− when input signal terminals "+" and "−" are at the same potential. Owing to unavoidable differences in the construcion of P1, P2, N7 and N8, that desired condition rarely obtains in practice. It is therefore desirable to inject trimming current at the respective drain of P1 and P2 so as to counteract the aforementioned differences so that the desired nonminal output voltage can more nearly obtain.

To this end, current amplifier 12 receives input current $I_0$ from current supply IS at input terminal T1 and supplies respective output currents $I_1/m$ and $I_2/m$ at output terminals T2 and T3, respectively. The respective gates and drains of N-channel FETs N1 and N2 connect together at input terminal T1 to receive input current $I_0$. The drain-source conduction path of N1 is serially connected with the drain-source conduction path of N-channel FET N3 so that both conduct a current $I_1$ which is a portion of current $I_0$. Similarly, the drain-source conduction path of N2 is serially connected with the drain-source conduction path of N-channel FET N4 so that both conduct current $I_2$ which is a portion of current $I_0$ complementary to $I_1$. That is, $I_1+I_2=I_0$. The respective sources of N3 and N4 connect to terminals T5 and T4, respectively, across which is connected the resistance path of potentiometer P. Adjustment arm A of potentiometer P connects to a common terminal at relatively negative supply 30. Thus, current $I_1$ flowing in N3 is conducted by a first resistance path (left hand portion of P) to common terminal 30 while the current $I_2$ in N4 is conducted by a second resistance path (right hand portion of P) to common terminal 30.

The potential difference between terminals T1 and T5 and between T1 and T4 are maintained equal independent of the relative values of currents $I_1$ and $I_2$. Specifically, the gate of N3 connects to the drain of N4 and the gate of N4 connects to the drain of N3. That cross-coupling causes each of the T1-T5 and T1-T4 difference potentials to include the gate-source potential of a FET conducting current $I_1$ plus the gate-source potential of a FET conducting current $I_2$ so that modulation of the FET gate-source potentials by variations of $I_1$ and $I_2$ do not produce variations in the current gain of amplifier 12. The aforementioned potential differences thus being equal, it is readily seen that the currents $I_1$ and $I_2$ are substantially determined by the relative resistances of the left and right portions of potentiometer P as determined by the position of adjustment arm A. This occurs in similar manner to that of the bipolar transistor arrangement disclosed in the Limberg application referred to above. Thus, values of currents $I_1$ and $I_2$ are given by $$I_1 = [(I_0/2) + \delta] \quad (1)$$

$$I_2 = [(I_0/2) - \delta] \quad (2)$$

where $\delta$ indicates a current imbalance owing to the adjustment of potentiometer P.

Current amplifier 12 provides a plurality of related output currents at terminals T2 and T3. N-channel FETs N5 and N6 are connected with their respective gate and source electrodes connected to like electrodes of N3 and N4, respectively. Because N5 receives gate-source potential equal to that of N3, its drain-source current will be proportionally related to drain-source current $I_1$ of N3. Similarly, N6 drain current is proportionally related to $I_2$ flowing in N4. Those proportional relations are determined by the respective ratios of the "active area" of transistor pairs N3, N5 and N4, N6. For FET's "active area" is the ratio of their channel-width to channel-length (W/L ratio). That ratio is indicated by the encircled characters proximate the source electrodes of the respective FET symbols in FIG. 1. Where N3 and N4 each have a predetermined active area m and where N5 and N6 each have a predetermined active area of unity, the currents supplied at terminals T2 and T3 are $$I_{T2} = I_1/m = [(I_0/2) + \delta]/m \quad (3)$$

$$I_{T3} = I_2/m = [(I_0/2) - \delta]m \quad (4)$$

Because the potentials at T2 and T3 need only be the source-drain potentials of N5 and N6, respectively, plus the respective potential across the respective left- and right-hand portions of P, current amplifier 12 can be utilized advantageously in cooperation with amplifier 10 where the low gate-source potentials of N7 and N8 establish the potentials at T2 and T3.

Because N1 through N6 are arranged on a common substrate, which could be a monolithic integrated circuit (IC) substrate, they operate at substantially the same temperature thus to exhibit parameters that track as substrate operating temperature varies. Potentiometer P is located external to the substrate and thus may be at a different operating temperature. Because both the temperature coefficient of resistance and the operating temperature of the left and right portions of the resistance path of potentiometer P are substantially the same, the ratio of resistances between T5 and A and between T4 and A is substantially unaffected by temperature. As a result, temperature-independent tracking of currents $I_{T2}$ and $I_{T3}$ obtains. This benefits the trimming of the normal output voltage at 70 because, after adjustment is made, it is not disturbed by temperature-induced variations of the trimming currents injected at the respective drains of P1 and P2.

FIG. 2 is a schematic diagram of an extrapolated band-gap voltage reference circuit of the type shown in U.S. patent application Ser. No. 052,734 entitled BAND-GAP REFERENCE filed by O. H. Schade, Jr. on June 28, 1979, which invention is assigned to the same assignee as is the present invention, and which application is incorporated herein by reference for the purpose of describing in detail the band-gap reference shown in FIG. 2 of the present application.

In a band-gap voltage regulator, it is necessary to trim the output voltage to the band-gap voltage $E_{bg}$ so that minimum temperature coefficient obtains. Trimming is necessary to compensate for unavoidable departures in resistor values and in transistor characteristics from nominal, design-center values owing to production variations. One way to trim a band-gap reference is to adjust the relative current flows in a transistor pair 31, 32 shown in FIG. 2. Amplifier 33, of the type described above with reference to FIG. 1, is suitably employed to that end through adjustment of temperature-independent trimming currents using potentiometer P.

Amplifier 33 in FIG. 2 completes a degenerative feedback connection from the emitter circuits of transistors 31 and 32 to circuit point 69 for maintaining the potentials across resistors 34 and 35 substantially equal. As a result, transistors 31 and 32 are caused to operate at different emitter current densities so that a difference $\Delta V_{BE}$ between their respective base-emitter potentials is impressed upon resistor 36. That difference potential is increased by the ratio of the resistances of resistors 34 and 36 and exhibits a positive temperature coefficient. The increased difference potential is added to the base-emitter potential of transistor 31, which exhibits a negative temperature coefficient, so that substantially zero temperature coefficient potential $E_{bg}$ obtains between point 69 and ground terminal 30'. For silicon transistors, band-gap potential $E_{bg}$ is approximately 1.2 volts. Reference potential $E_{REF}$ appears at output terminal 70 and is proportional to band-gap potential $E_{bg}$ increased by the ratio of the resistances of resistors 61 and 62.

Adjustment of the potential at output terminal 70 for equal potentials at input terminals "+" and "−" is described above for amplifier 33. Viewed from another perspective, for any output potential $E_{REF}$, amplifier 33 can be trimmed so as to require a small predetermined input offset potential. Current flows in transistors 31 and 32 are trimmed by adjusting the potentials across resistors 34 and 35 with respect to each other, the difference therebetween being applied between terminals "+" and "−" as that offset potential.

Within amplifier 33, FETS P1 and P2 each exhibit a gate-source potential $V_{GS}$ that is dependent upon its drain-source current flow. When P1 and P2, and their respective drain-source currents, are identical, no potential difference appears between their respective gates. When P1 drain-source current exceeds that of P2, so will its $V_{GS}$ so that terminal "+" will be a slightly more positive potential than is terminal "−". Conversely, if P2 drain-source current exceeds that of P1, terminal "−" will be at a slightly more positive potential than is terminal "+". Such current differences in P1 and P2 are generated by adjusting the relative values of currents $I_1/m$ and $I_2/m$ using arm A of potentiometer P when amplifier 33 is used in cooperation with the band-gap reference of FIG. 2.

Modifications to the aforedescribed embodiments of the present invention are contemplated to be within the scope of the invention as encompassed in the claims following. In FIG. 1 for example, current supplies IT, IL and IS can be arranged to supply proportionally related currents as indicated by interconnection 14 therebetween. Such proportionally related currents may be obtained in a conventional current mirror amplifier having a plurality of output transistors. That arrangement is desirable so that trimming currents $I_1/m$ and $I_2/m$ will be caused to vary proportionally to variations in tail current IT to long tailed pair LTP. As a result, variations in $I_1/m$ and $I_2/m$ in proportion to variations in IT tend to maintain the ratio of drain currents in P1 and P2 so that, for example, the adjusted value of potential at terminal 70 is not disturbed.

It is noted that potentiometer P may be replaced by fixed resistors in predetermined resistance ratio. Although it is satisfactory for those fixed resistors to be constructed on the substrate, it is preferred that the fixed resistors be external to the substrate to avoid the inconvenience and expense of on-chip trimming of resistance values, and to obtain convenient adjustability by the end-user of the integrated circuit.

It is also satisfactory that the respective resistances between terminals T4, T5 and common terminal 30 be obtained by resistors of relatively low temperature coefficient so that they may be operated at different temperatures without disturbing the temperature independence of the currents supplied from output terminals T2 and T3.

By way of further example, additional temperature-independent output currents can be generated by further transistors connected to N3 and N4 in like manner to that in which N5 and N6 connect.

If drain-gate connection 16 for N2 were to be deleted, input current $I_0$ would flow completely into transistor N1 and the drain current of N2 could then be employed to supply an additional output current.

In still further example, N1–N6 can be replaced by bipolar transistors. The "active area" factors thereof being the area of their respective base-emitter junctions.

What is claimed is:

1. A current amplifier comprising:
    a substrate;
    an input terminal, first and second output terminals, and third and fourth terminals on said substrate;
    first, second, third, fourth, fifth and sixth transistors of like conductivity type on said substrate, each having respective output and common electrodes and a main conduction path therebetween, and each having a respective input electrode;
    means connecting the respective input and output electrodes of said first and second transistors to said input terminal;
    means connecting the common electrode of said first transistor to the output electrode of said third transistor and to the respective input electrodes of said fourth and sixth transistors;
    means connecting the common electrode of said second transistor to the output electrode of said fourth transistor and to the respective input electrodes of said third and fifth transistors;
    means coupling the respective output electrodes of said fifth and sixth transistors to said first and second output terminals respectively;
    means connecting the respective common electrodes of said third and fifth transistor to said third terminal;
    means connecting the respective common electrode of said fourth and sixth transistors to said fourth terminal;
    a common terminal; and
    resistance means for completing respective first and second resistance connections between said third and fourth terminals, respectively, and said common terminal, said first and second resistance connections exhibiting respective resistances in a proportion substantially unaffected by temperature.

2. The current amplifier of claim 1 wherein said resistance means includes a potentiometer external to said substrate having a resistance path connected between said third and fourth terminals to serve as said first and second resistance connections, and having an adjustment arm for connecting a point on said resistance path to said common terminal.

3. The current amplifier of claim 1 or 2 wherein the resistances of said first and second resistance connections exhibit substantially similar temperature coefficients and said first and second resistance connections are arranged to operate at substantially the same temperature.

4. The current amplifier of claim 1 wherein said substrate is a monolithic integrated circuit.

5. The current amplifier of claim 1 wherein said third and fourth transistors are each of first predetermined active area and wherein said fifth and sixth transistors are each of second predetermined active area.

6. The current amplifier of claim 5 wherein said first predetermined active area is at least as large as said second predetermined active area.

7. In an amplifier circuit including differential amplifying means having a pair of input terminals for receiving input signals thereacross, and having a pair of output terminals for supplying output signals therefrom responsive to said input signals, said load means connected between said pair of output terminals and a common connection for receiving said output signals, current amplifying means comprising:
    a substrate;
    first, second, third, fourth, fifth and sixth transistors of like conductivity type on said substrate, each having respective output and common electrodes and a main conduction path therebetween, and each having a respective input electrode;
    means for supplying a current to a node to which the respective input and output electrodes of said first and second transistors connect;
    means connecting the common electrode of said first transistor to the output electrode of said third transistor and to the respective input electrodes of said fourth and sixth transistors;
    means connecting the common electrode of said second transistor to the output electrode of said fourth transistor and to the respective input electrodes of said third and fifth transistors;
    means coupling the respective output electrodes of said fifth and sixth transistors to respective first and second ones of said pair of output terminals respectively;
    first and second terminals;
    means connecting the respective common electrodes of said third and fifth transistor to said first terminal;
    means connecting the respective common electrodes of said fourth and sixth transistors to said second terminal;
    a common terminal; and
    resistance means for completing respective first and second resistance connections between said first and second terminals, respectively, and said common terminal, said first and second resistance connections exhibiting respective resistances in proportion substantially unaffected by temperature.

8. The current amplifier of claim 7 wherein said resistance means includes a potentiometer external to said substrate having a resistance path connected between said first and second terminals to serve as said first and second resistance connections, and having an adjustment arm for connecting a point on said resistance path to said common terminal.

9. The current amplifier of claim 7 or 8 wherein the resistances of said first and second resistance connections exhibit substantially similar temperature coefficients and said first and second resistance connections are arranged to operate at substantially the same temperature.

10. The current amplifier of claim 7 wherein said third and fourth transistors are each of first predetermined active area and wherein said fifth and sixth transistors are each of second predetermined active area.

11. The current amplifier of claim 10 wherein said first predetermined active area is at least as large as said second predetermined active area.

12. The current amplifier of claim 7 wherein said substrate is a monolithic integrated circuit, said differential amplifying means and said load means being included on said substrate.

* * * * *

UNITED STATES PATENT AND TRADEMARK OFFICE
CERTIFICATE OF CORRECTION

PATENT NO. : 4,366,444

DATED : December 28, 1982

INVENTOR(S) : Otto H. Schade, Jr.

It is certified that error appears in the above-identified patent and that said Letters Patent is hereby corrected as shown below:

Column 2, line 21    "construcion" should be --construction--.

Column 3, line 33    "$I_{T3}=I_2/m=[(I_0/2)-\delta]m$" should be --$I_{T3}=I_2/m=[(I_0/2)-\delta]/m$--.

Column 6, line 27    "said", second occurrence thereof, should be --and--.

Signed and Sealed this

Twenty-second Day of February 1983

[SEAL]

Attest:

GERALD J. MOSSINGHOFF

Attesting Officer    Commissioner of Patents and Trademarks